US012768596B2

(12) United States Patent
Dhamodharan et al.

(10) Patent No.: US 12,768,596 B2
(45) Date of Patent: Oct. 20, 2026

(54) REFLECTOR FOR PROCESS CHAMBER

(71) Applicant: Applied Materials, Inc., Santa Clara, CA (US)

(72) Inventors: Raja Murali Dhamodharan, Madurai (IN); Shu-Kwan Lau, Sunnyvale, CA (US); Shainish Nellikka, Bangalore (IN); Enle Choo, Saratoga, CA (US); Kalaivanan Mohanadass, Santa Clara, CA (US); Aniketnitin Patil, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 719 days.

(21) Appl. No.: 18/355,938

(22) Filed: Jul. 20, 2023

(65) Prior Publication Data

US 2025/0027716 A1 Jan. 23, 2025

(51) Int. Cl.
*F27B 17/00* (2006.01)
*H05B 3/00* (2006.01)
*H10P 72/00* (2026.01)

(52) U.S. Cl.
CPC ....... *F27B 17/0025* (2013.01); *H05B 3/0047* (2013.01); *H10P 72/0436* (2026.01)

(58) Field of Classification Search
CPC . F27B 17/0025; H05B 3/0047; H10P 72/0436
See application file for complete search history.

(56) References Cited

U.S. PATENT DOCUMENTS 10,119,192 B2 11/2018 Aboagye et al.

*Primary Examiner* — Robert G Bachner
(74) *Attorney, Agent, or Firm* — Patterson + Sheridan, LLP

(57) ABSTRACT

A modular reflective heating system for use in a process chamber is provided. The modular reflective heating system includes: a plurality of connectors; a plurality of lamps, each lamp connected to at least one of the connectors; a reflector including: a base; and a reflective assembly including a first plurality of reflective portions and a second plurality of reflective portions. Each reflective portion in the first plurality of reflective portions and the second plurality of reflective portions is connected to the base, and each reflective portion in the first plurality of reflective portions and the second plurality of reflective portions is configured to be individually disconnected from the base. The modular reflective heating system further includes a spare reflective portion configured to replace a first reflective portion in the first plurality of reflective portions or the second plurality of reflective portions.

20 Claims, 6 Drawing Sheets

REFLECTOR FOR PROCESS CHAMBER

BACKGROUND

Embodiments of the present disclosure generally relate to improved reflectors for use in process chambers, such as semiconductor process chambers.

DESCRIPTION OF THE RELATED ART

Process chambers, such as semiconductor process chambers, are often heated to high temperatures to perform different processes on substrates, such as semiconductor substrates. Many process chambers include one or reflectors positioned around the substrate (e.g., over the substrate support) to reflect energy (e.g., infrared energy) towards the substrate during processing. These reflector can help control the temperature of the substrate during the process as well as the temperature uniformity across the substrate during the process. Temperature control of the substrate and temperature uniformity can be affected by the reflector used in the process chamber. Reflectors are often replaced with different reflectors in an attempt to improve the temperature control and temperature uniformity for a given process.

When a reflector having different reflective properties is to be used the existing reflector is replaced. Replacing a reflector for a process chamber is a time consuming process that includes (1) disconnecting and removal of the existing reflector and numerous other components of the process chamber (e.g., lid, lamps, etc.) and (2) installing the new reflector and reinstalling the components that were removed and/or disconnected. This time consuming process results in significant downtime for the process chamber. Accordingly, there is an ongoing need for methods and related equipment that can reduce the amount of downtime associated with reflector replacement.

SUMMARY

In one embodiment, a modular reflective heating system for use in a process chamber is provided. The modular reflective heating system includes: a plurality of connectors; a plurality of lamps, each lamp connected to at least one of the connectors; a reflector including: a base; and a reflective assembly including a first plurality of reflective portions and a second plurality of reflective portions, wherein each reflective portion in the first plurality of reflective portions and the second plurality of reflective portions is connected to the base, and each reflective portion in the first plurality of reflective portions and the second plurality of reflective portions is configured to be individually disconnected from the base; and a spare reflective portion configured to replace a first reflective portion in the first plurality of reflective portions or the second plurality of reflective portions.

In another embodiment, a processing system is provided comprising: a process chamber comprising: a chamber body disposed around a process volume; a substrate support in the process volume; a reflector positioned over or below the substrate support, the reflector comprising: a base; and a reflective assembly including a first plurality of reflective portions and a second plurality of reflective portions, wherein each reflective portion in the first plurality of reflective portions and the second plurality of reflective portions is connected to the base, and each reflective portion in the first plurality of reflective portions and the second plurality of reflective portions is configured to be individually disconnected from the base; and a spare reflective portion configured to replace a first reflective portion in the first plurality of reflective portions or the second plurality of reflective portions.

In another embodiment, a processing system is provided comprising: a process chamber comprising: a chamber body disposed around a process volume; a substrate support in the process volume; a plurality of lamps; a reflector positioned over or below the substrate support, the reflector comprising: a base; and a reflective assembly including a first plurality of reflective portions and a second plurality of reflective portions, wherein the plurality of lamps are positioned between the substrate support and the reflector, each reflective portion in the first plurality of reflective portions and the second plurality of reflective portions is connected to the base, and each reflective portion in the first plurality of reflective portions and the second plurality of reflective portions is configured to be individually disconnected from the base; and a spare reflective portion configured to replace a first reflective portion in the first plurality of reflective portions or the second plurality of reflective portions, wherein the spare reflective portion has a reflective surface configured to face one of the lamps when the spare reflective portion is coupled to the base, and the reflective surface on the spare reflective portion has a different radius of curvature, a different size, or a different coating than corresponding reflective surface on the first reflective portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to improved reflectors for use in process chambers, such as semiconductor process chambers. The improved reflectors have a modular design allowing one or more reflective portions of a reflector to be easily replaced with one or different reflective portions that can alter the thermal performance of the reflector while the other portions of the reflector remain installed. For example, a reflective portion of a reflector can be replaced with a new portion that has a different reflecting surface (e.g., a different coating or a different radius curvature) or a different set of internal cooling channels to allow the thermal performance of the reflector to be improved without removing the entire reflector.

Figure 1:
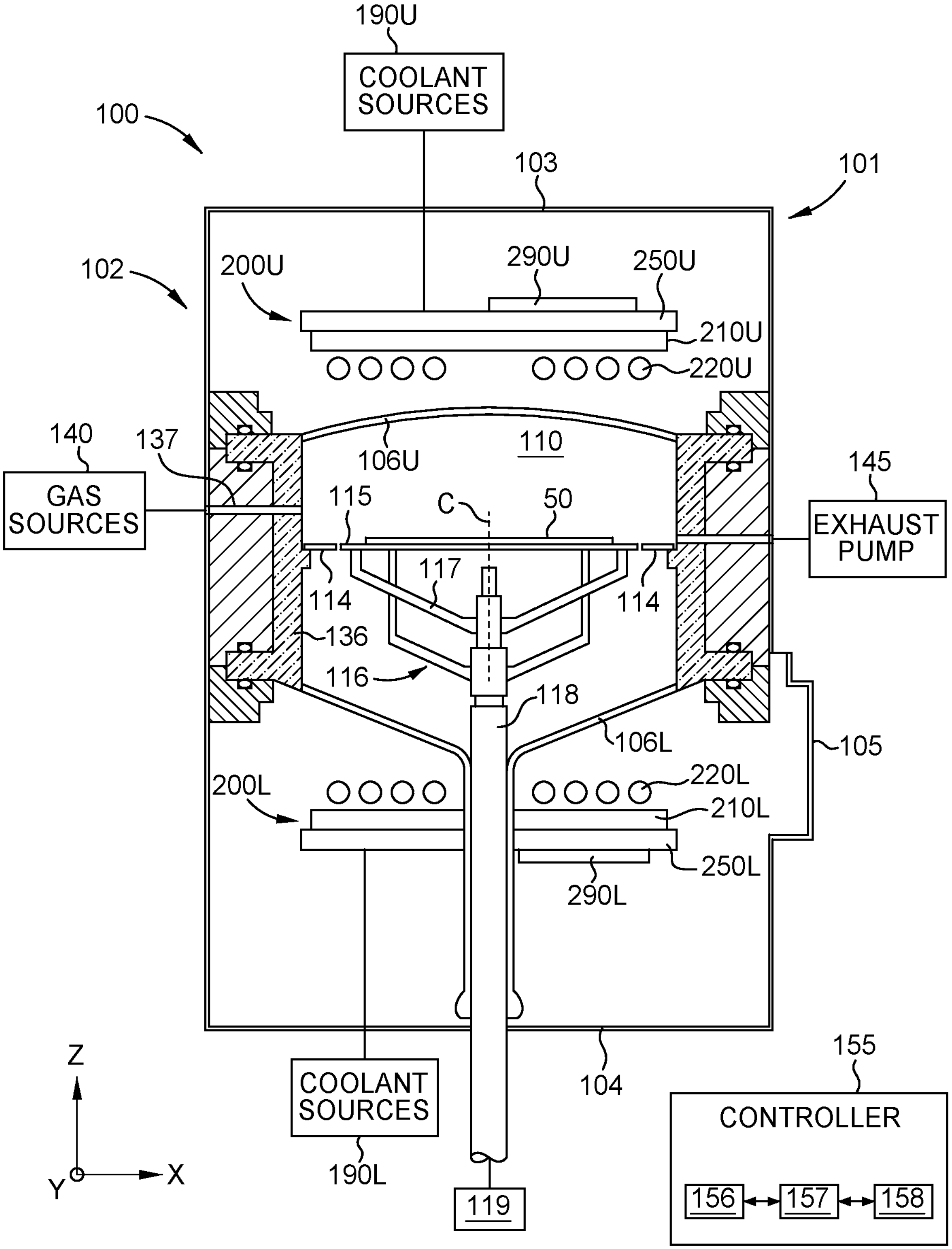
FIG. 1 is a cross-sectional view of a processing system 100, according to one embodiment.

FIG. 1 is a cross-sectional view of a processing system 100, according to one embodiment. The processing system 100 includes a process chamber 101, one or more gas sources 140, an exhaust pump 145, upper cooling sources 190U, lower cooling sources 190L, and a controller 155. The processing system 100 can be configured to perform deposition processes on substrates, such as epitaxial deposition processes, in the process chamber 101.

The process chamber 101 includes a chamber body 102 that includes a top 103, a bottom 104, and one or more sides 105. In some embodiments, the chamber body 102 can be made of a process resistant material, such as aluminum or stainless steel, for example 316L stainless steel. The chamber body 102 is disposed around structural components of the processing chamber 101, such as an upper window 106U, a lower window 106L, an inner liner 136, and an outer line 137. The liners 136, 137 can be positioned between the windows 106U, 106L and the chamber body 102 to insulate the windows 106U, 106L from the chamber body 102. The windows 106U, 106L and the liners 136, 137 enclose an interior volume 110 (also referred to as process volume) of the process chamber 101. In one embodiment, the windows 106U, 106L can each be formed of quartz.

The process chamber 101 includes an upper reflector 200U positioned between the upper window 106U and the top 103 of the chamber body 102. The process chamber 101 further includes a lower reflector 200L positioned between the lower window 106L and the bottom 104 of the chamber body 102. The reflectors 200U, 200L assist in heating the substrate during processing and maintaining temperature uniformity of the substrate during processing. Additional details on the reflectors 200U, 200L are provided below.

The process chamber 101 further includes a substrate support assembly 116. The substrate support assembly 116 can include supports 117 and a shaft 118 that is connected to the supports 117. A susceptor 115 can be positioned on the supports 117. The process chamber 101 can further include an actuator 119 that is coupled to the shaft 118 of the substrate support assembly 116. The actuator 119 is configured to rotate the shaft 118 and the susceptor 115 about a central vertical axis C extending through a center of the shaft 118 and the susceptor 115. A substrate 50 can be positioned on the susceptor 115 during processing, such as during an epitaxial deposition.

Gases can be provided to the interior volume 110 from the gas sources 140 during depositions or other processes. These gases can be exhausted from the interior volume 110 by the exhaust pump 145. The process chamber 101 can further include a preheat ring 114 that can be positioned around the susceptor 115. In some embodiments, purge gas (not shown) can be provided below the susceptor 115 to assist in preventing process gases from reaching areas in the process chamber 101 below the susceptor 115 and causing unintended deposits.

The process chamber 101 can further include a plurality of upper lamps 220U and a plurality of lower lamp 220L for heating of the substrate 50 and components in the interior volume 110, such as the susceptor 115. The upper lamps 220U are positioned between the upper window 106U and the upper reflector 200U. The lower lamps 220L are positioned between the lower window 106L and the lower reflector 200L. In one embodiment, the upper lamps 220U and the lower lamp 220L are infrared (IR) lamps.

Simplified versions of the reflectors 200U, 200L and the lamps 220U, 220L are shown in FIG. 1 for ease of illustration. Additional details on the reflectors 200U, 200L and the lamps 220U, 220L are provided below. The upper reflector 200U includes an upper base 250U and an upper reflective assembly 210U coupled (e.g., fastened) to the upper base 250U. Supports (not shown) can be used to support the upper reflector 200U over the upper window 106U in the process chamber 101.

The upper reflective assembly 210U is positioned between the upper lamps 220U and the upper base 250U. The upper reflective assembly 210U includes a plurality of reflective portions 211-214 (see FIG. 2A) that are configured to reflect radiation (e.g., infrared radiation) towards the substrate 50 during processing. The upper base 250U can be fluidly coupled to the upper cooling sources 190U. In one embodiment, the upper cooling sources 190U can include a cooling water source and a cooling air source. Cooling water and cooling air from the upper cooling sources 190U can be provided to or circulated through the upper base 250U during processing to assist in maintaining a temperature setpoint for the upper reflector 200U as well as for assisting in maintaining temperature uniformity across the upper reflector 200U during processing.

Similarly, the lower reflector 200L includes a lower base 250L and a lower reflective assembly 210L coupled (e.g., fastened) to the lower base 250L. The lower base 250L and the lower reflective assembly 210 can each surround the shaft 118. Supports (not shown) can be used to support the lower reflector 200L below the lower window 106L in the process chamber 101. The lower reflective assembly 210L is positioned between the lower lamps 220L and the lower base 250L. The lower reflective assembly 210L includes a plurality of reflective portions 211-214 (see FIG. 2C) that are configured to reflect radiation (e.g., infrared radiation) towards the substrate 50 during processing.

In some embodiments, the reflective portions of the reflective assemblies 210U, 210L can be formed of gold, alumina, or another metal or alloy that is coated with gold or alumina, so that the reflecting surface is formed of gold or alumina. In some embodiments, the bottom surface of the upper base 250U and the upper surface of the lower base 250L can be coated with alumina to reflect any radiation from the lamps that reaches these surfaces. The lower base 250L can be fluidly coupled to the lower cooling sources 190L. In one embodiment, the lower cooling sources 190U can include a cooling water source and a cooling air source. Cooling water and cooling air from the lower cooling sources 190L can be provided to or circulated through the lower base 250L during processing to assist in maintaining a temperature setpoint for the lower reflector 200L as well as for assisting in maintaining temperature uniformity across the lower reflector 200L during processing.

As described in further detail below each reflective portion 211-214 in the upper reflective assembly 210U (FIG. 2A) and the lower reflective assembly 210L (FIG. 2C) is separately removable from the corresponding base 250U, 250L, so that each reflective portion can be individually disconnected from the corresponding base 250U, 250L and replaced with a different reflective portion. The ability to replace individual portions of a reflector instead of an entire reflector as conventionally done in semiconductor processing can allow for substantially less downtime for a process chamber when a change to a reflector is made.

The process chamber 101 can further include a plurality of upper temperature sensors 290U and a plurality of lower temperature sensors 290L. The plurality of upper temperature sensors 290U can be positioned over the upper reflector 200U and can be configured to monitor the temperature of different portions of the substrate 50 and/or susceptor 115 during processing. Similarly, the plurality of lower temperature sensors 290L can be positioned below the lower reflector 200L and can be configured to monitor the temperature of different portions of the substrate 50 and/or susceptor 115 during processing. In one embodiment, the temperatures sensors 290U, 290L can each be pyrometers. The temperatures sensors 290U, 290L can be connected to the controller 155. The controller 155 can use the measurements from the temperature sensors 290U, 290L to control the power provided to the corresponding lamps 220U, 220L during processing, which can be used to control the temperature of different portions of the substrate 50 during processing.

The processing system 100 also includes the controller 155 for controlling processes performed by the processing system 100. The controller 155 can be any type of controller used in an industrial setting, such as a programmable logic controller (PLC). The controller 155 includes a processor 157, a memory 156, and input/output (I/O) circuits 158. The controller 155 can further include one or more of the following components (not shown), such as one or more power supplies, clocks, communication components (e.g., network interface card), and user interfaces typically found in controllers for semiconductor equipment.

The memory 156 can include non-transitory memory. The non-transitory memory can be used to store the programs and settings described below. The memory 156 can include one or more readily available types of memory, such as read only memory (ROM) (e.g., electrically erasable programmable read-only memory (EEPROM), flash memory, floppy disk, hard disk, or random access memory (RAM) (e.g., non-volatile random access memory (NVRAM).

The processor 157 is configured to execute various programs stored in the memory 156, such as epitaxial deposition processes and other processes (e.g., cleaning processes). During execution of these programs, the controller 155 can communicate to I/O devices through the I/O circuits 158. For example, during execution of these programs and communication through the I/O circuits 158, the controller 155 can control outputs, such as the power provided to the lamps 220U, 220L for heating the components in the interior volume 110 as well as the position of valves and/or the speed of pumps for controlling the flowrate of cooling water or cooling gas through the reflectors 200U, 200L. The memory 156 can further include various operational settings used to control the processing system 100. For example, the settings can include temperature setpoints for the substrate 50 and/or susceptor 115 during different processes.

Figure 2A:
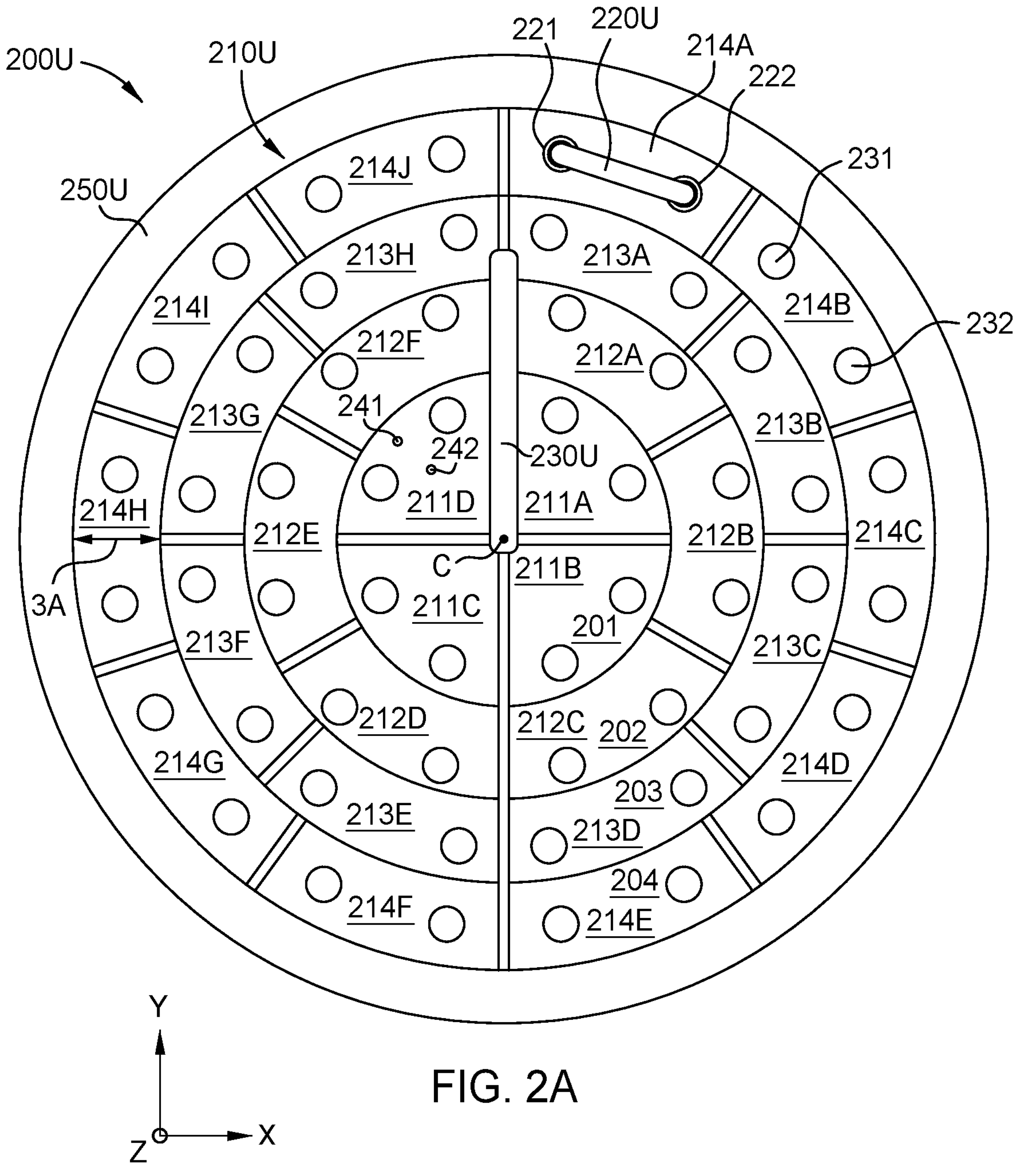
FIG. 2A is a bottom view of the upper reflector of FIG. 1, according to one embodiment.

FIG. 2A is a bottom view of the upper reflector 200U of FIG. 1, according to one embodiment. FIG. 2 also shows an upper lamp 220 and two connectors 221, 222 as described in further detail below. The upper reflector 200U, the upper lamps 220, and the connectors 221, 222 can collectively be referred to as a modular reflective heating system.

The upper reflector 200U includes the upper reflective assembly 210U that is coupled (e.g., fastened) to the upper base 250U. The upper reflective assembly 210U includes a plurality of reflective portions 211-214 arranged in a plurality of zones 201-204. The plurality of zones 201-204 include a first zone 201, a second zone 202, a third zone 203, and a fourth zone 204.

The first zone 201 can include a first plurality of four reflective portions 211A-211D that form a central section of the upper reflective assembly 210U. In some embodiments, the first zone 201 can have a circular shape, elliptical shape, rectangular shape, diamond shape, or an irregular shape. Each reflective portion 211A-211D can be positioned at a different angular location around a center C of the upper reflective assembly 210U. For example, each reflective portion 211A-211D is shown occupying a different quadrant around the center C of the upper reflective assembly 210U.

The second zone 202 can be a ring-shaped zone positioned between the first zone 211 and the third zone 213. The second zone 202 includes a second plurality of six reflective portions 212A-212F arranged in a ring-shaped pattern around the first zone 201. The first plurality of reflective portions 211A-211D are positioned inside the ring-shaped pattern of the second plurality of reflective portions 212A-212F. Used herein, ring-shaped includes rings having a circular, elliptical, polygonal shaped rings, or any combination thereof. The reflective portions and lamps described herein can be arranged in ring-shaped patterns.

The third zone 203 can be a ring-shaped zone positioned between the second zone 202 and the fourth zone 204. The third zone 203 includes a third plurality of eight reflective portions 213A-213H arranged in a ring-shaped pattern around the second zone 202.

The fourth zone 204 can be a ring-shaped zone positioned as an outermost zone around the third zone 203. The third zone 203 includes a fourth plurality of ten reflective portions 213A-213J arranged in a ring-shaped pattern around the third zone 203.

With reference to the reflective portion 214B, each reflective portion 211-214 can include a first opening 231 and a second opening 232. With reference to reflective portion 214A, a first connector 221 extends into the first opening 231 to make a first connection (e.g., power connection) with one of the upper lamps 220U. Similarly, a second connector 222 extends into the second opening 232 of the reflective portion 214A to make a second connection (e.g., ground connection) with one of the upper lamps 220U. In some embodiments, the openings 231, 232 can extend to an edge of the corresponding reflective portion 211-214 and line up with an opening of a neighboring reflective portion 211-214, so that a larger opening is formed by the alignment of the openings of the two neighboring reflective portions 211-214. The connectors 221, 222 can extend through openings in the base 250U and the reflective assembly 210U. Although two connectors 221, 222 are shown for the lamp 220U, in some embodiments, a single connector, such as a single connector providing a power and ground connection, can extend through a corresponding single hole in the base and reflective assembly.

Although only one lamp 220U and one set of connectors 221, 222 are shown in FIG. 2A to not clutter the drawing, a set of connectors 221, 222 can extend into or through the openings 231, 232 of each reflective portion 211-214, so that a lamp 220U can be connected to each of these connectors 221, 222. Each lamp 220U, 220L (see FIG. 2C) can be connected across each reflective portion 211-214, such as directly under each reflective portion 211-214 of the upper reflective assembly 210U or directly over each reflective portion 211-214 of the lower reflective assembly 210L (see FIG. 2C). In some embodiments, each lamp 220U, 220L is configured to entirely underlie or entirely overlie a single reflective portion 211-214 of the corresponding reflective assembly 210U, 210L. The connectors 221, 222 can mechanically support each lamp 220U, 220L and provide electrical power to each corresponding lamp 220U, 220L. The controller 155 (FIG. 1) can adjust the electrical power provided to each lamp 220U, 220L, so that the heat provided by each lamp 220U, 220L can be individually adjusted to control the temperature across different portions (e.g., different radial locations) of the substrate 50 during processing, for example based on measurements from the corresponding temperature sensors 290U, 290L.

The upper reflective assembly 210U further includes a slot 230U extending radially outward from a location at or near the center C of the upper reflective assembly 210U in the first zone 201 to a location in the third zone 203. The slot 230U is an opening that is positioned to allow the upper temperature sensors 290U to perform temperature measurements on the substrate 50 and/or susceptor 115 during processing.

With reference to reflective portion 211D, each reflective portion 211-214 can further include a plurality of cooling holes 241 for cooling the corresponding reflective portion 211-214 and a plurality of fastener holes 242 for mounting the corresponding reflective portion 211-214 to the upper base 250U. In some embodiments each reflective portion 211-214 can include a plurality, such as ten or more cooling holes 241 and a plurality, such as ten or more fastener holes 242. Only one cooling hole 241 and one fastener hole 242 are shown in order to not clutter the drawing. Cooling air from the cooling sources 190U can be directed through the plurality of cooling holes 241 during processing to cool the reflective portions 211-214.

Figure 2B:
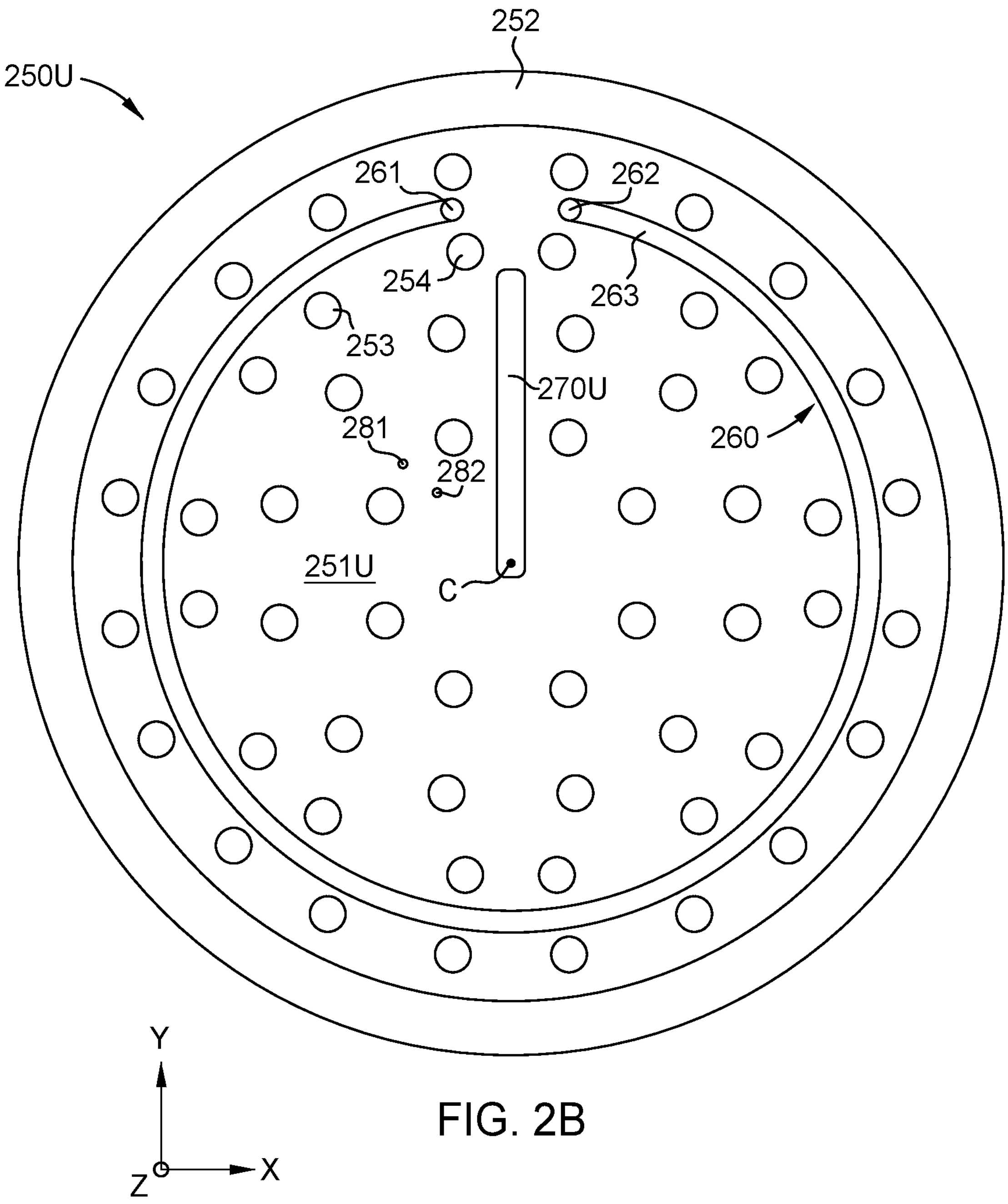
FIG. 2B is a bottom schematic view of the upper base from FIG. 1, according to one embodiment.

FIG. 2B is a bottom schematic view of the upper base 250U from FIG. 1, according to one embodiment. The upper base 250U is shown as being transparent, so that the cooling channel described below can be more clearly shown. The upper base 250U includes an inner body 251U and an outer rim 252. The upper reflective assembly 210U (FIG. 2A) is configured to be mounted to the inner body 251U.

The upper base 250U can include a first plurality of openings 253 and a second plurality of openings 254. Each opening 253 in the first plurality of openings 253 is positioned to align with one of the first openings 231 of the upper reflective assembly 210U when the upper reflective assembly 210 (FIG. 2A) is mounted to the upper base 250U. Similarly, each opening 254 in the second plurality of openings 254 is positioned to align with one of the second openings 232 of the upper reflective assembly 210U when the upper reflective assembly 210 (FIG. 2A) is mounted to the upper base 250U.

The upper base 250U can further include a plurality of cooling holes 281 to assist with directing cooling gas from the upper cooling sources 190U to the reflective portions 211-214 of the upper reflective assembly 210U. Each cooling hole 281 is positioned to align with one of the cooling holes 241 on one of the reflective portions 211-214 of the upper reflective assembly 210 when the upper reflective assembly 210 is mounted (FIG. 2A) to the upper base 250U.

The upper base 250U can further include plurality of fastener holes 282 (e.g., threaded holes) for mounting the corresponding reflective portions 211-214 to the upper base 250U. Each fastener hole 282 is positioned to align with one of the fastener holes 242 on one of the reflective portions 211-214 of the upper reflective assembly 210 when the upper reflective assembly 210 (FIG. 2A) is positioned to be mounted (e.g., fastened) to the upper base 250U.

The upper base 250U can further include a cooling channel 260 configured to cool the upper base 250 and reflective assembly 210U. The cooling channel 260 can extend through an interior of the inner body 251U of the upper base 250U. The cooling channel 260 includes an inlet 261, an outlet 262, and an inner channel 263 extending through the interior of the inner body 251U of the upper base 250U from the inlet 261 to the outlet 262. Cooling water or another coolant from the upper cooling sources 190U can be directed through the cooling channel 260 during processing to assist in preventing the upper reflector 200U from overheating during processing. Although the cooling channel 260 is shown as a single arc at one radial location relative to the center C of the upper base 250U, in some embodiments the cooling channel 260 can extend through more locations of the interior of the inner body 251U, such as to locations closer to the center C of the upper base 250U. Although not shown, in some embodiments, the cooling channel 260 can be configured with a plurality of inlets and outlets along the inner channel 263 that align with inlets and outlets on corresponding reflective portions 211-214, so that cooling fluid can be circulated through each of the reflective portions 211-214 during processing.

The upper base 250U can further include a slot 270U that is configured to align with the slot 230U (see FIG. 2A) when the upper reflective assembly 210U is mounted to the upper base 250U. The alignment of the slots 230U, 270U provide an opening to allow the temperature sensors 290U to measure the temperature of the substrate 50 and/or susceptor 115 during processing.

Figure 2C:
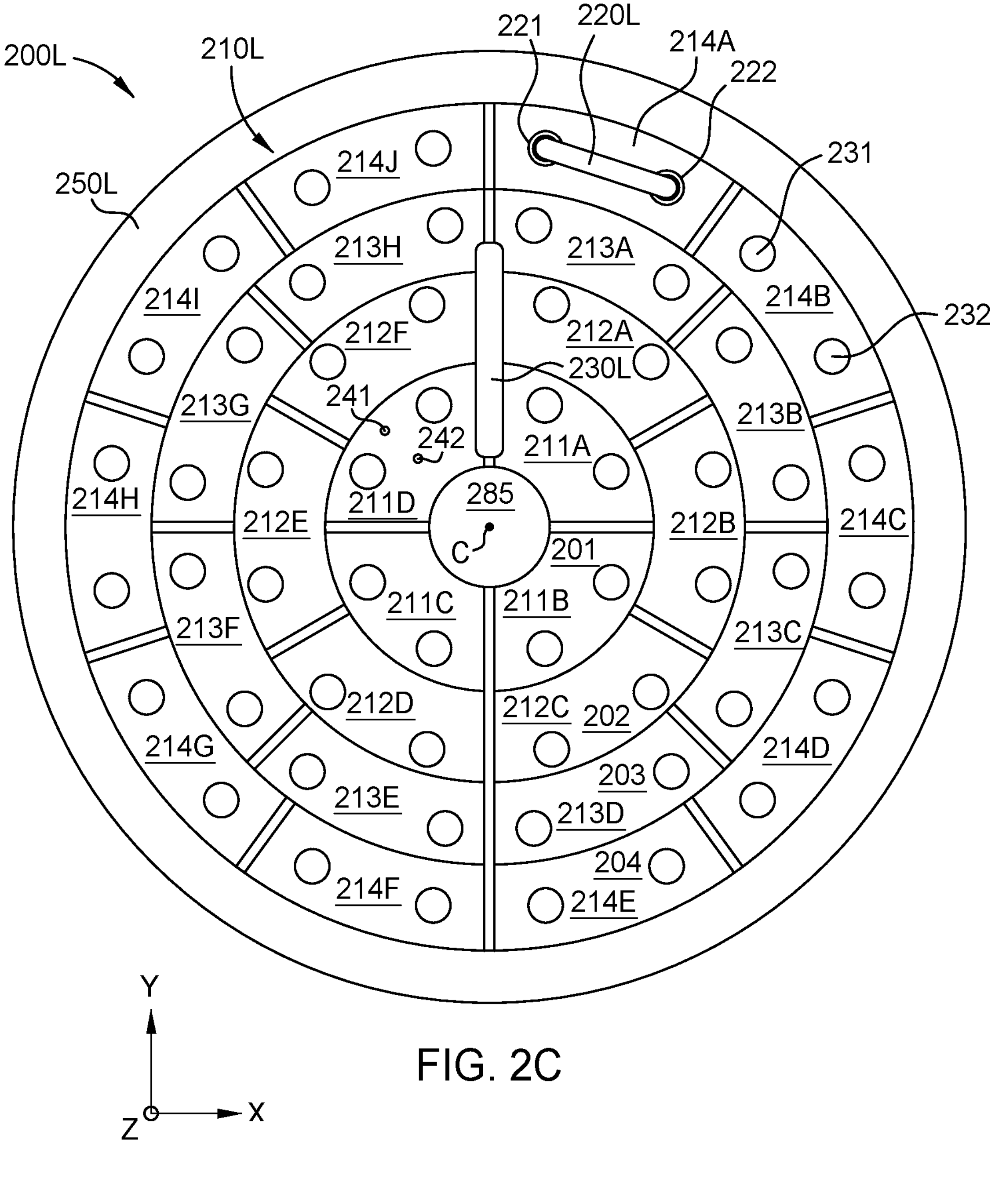
FIG. 2C is a top view of the lower reflector of FIG. 1, according to one embodiment.

FIG. 2C is a top view of the lower reflector 200L of FIG. 1, according to one embodiment. Although not required, the lower reflector 200L can be substantially similar to the upper reflector 200U. Unless noted otherwise, the description provided above for the upper reflector 200U also applies to the lower reflector 200L as the lower reflector 200L is in many ways the same as or identical to the upper reflector 200U if the upper reflector 200U were flipped upside down.

The lower reflector 200L includes the lower reflective assembly 210L that is coupled (e.g., fastened) to the lower base 250L. The differences between the upper base 250U (FIG. 2B) and the lower base 250L are described below in reference to FIG. 2D. The lower reflective assembly 210L is the same as the upper reflective assembly 210U except for the following differences. The lower reflective assembly 210L includes a central opening 285 to accommodate the shaft 118 of the substrate support assembly 116 (FIG. 1). The central opening 285 makes the reflective portions 211A-211D in the first zone 201 somewhat smaller than the corresponding reflective portions 211A-214 in the first zone 201 of the upper reflective assembly 210U. Also, the lower reflective assembly 210L includes a slot 230L that is smaller than the corresponding slot 230U described above. The slot 230L provides an opening for the temperature measurements performed by the lower temperature sensors 290L.

Figure 2D:
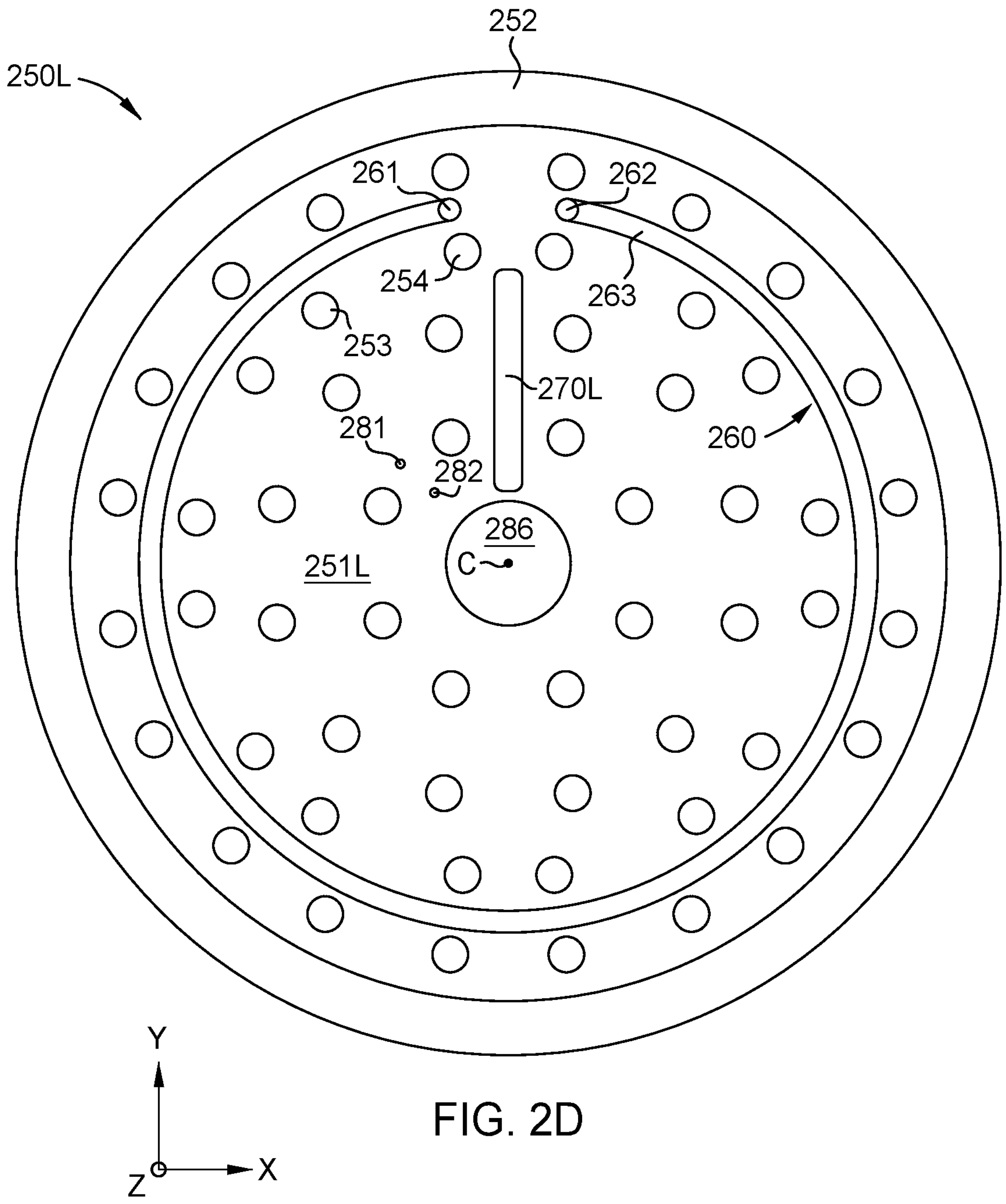
FIG. 2D is a top schematic view of the lower base 250L from FIG. 1, according to one embodiment.

FIG. 2D is a top schematic view of the lower base 250L from FIG. 1, according to one embodiment. The upper base 250U is shown as being transparent, so that the cooling channel 260 can be more clearly shown. The lower base 250L is the same as the upper base 250U described above except that the lower base 250L includes an inner body 251L that is different than the inner body 251U included in the upper base 250U. The lower base 250L includes the inner body 251L and the outer rim 252. The lower reflective assembly 210L (FIG. 2C) is configured to be mounted to the inner body 251L.

The inner body 251L of the lower base 250L is the same as the inner body 251U of the upper base 250U (FIG. 2B) described above except that (1) the inner body 251L of the lower base 250L includes a central opening 286 to accommodate the shaft 118 of the substrate support assembly 116 (FIG. 1), and (2) the inner body 251L includes a slot 270L that is smaller than the corresponding slot 270U included in the inner body 251 of the upper base 250U. The slot 270L provides an opening for the temperature measurements performed by the lower temperature sensors 290L (FIG. 1). The slot 270L aligns with the slot 230L when the lower reflective assembly 210L is mounted to the lower base 250L.

Figure 3A:
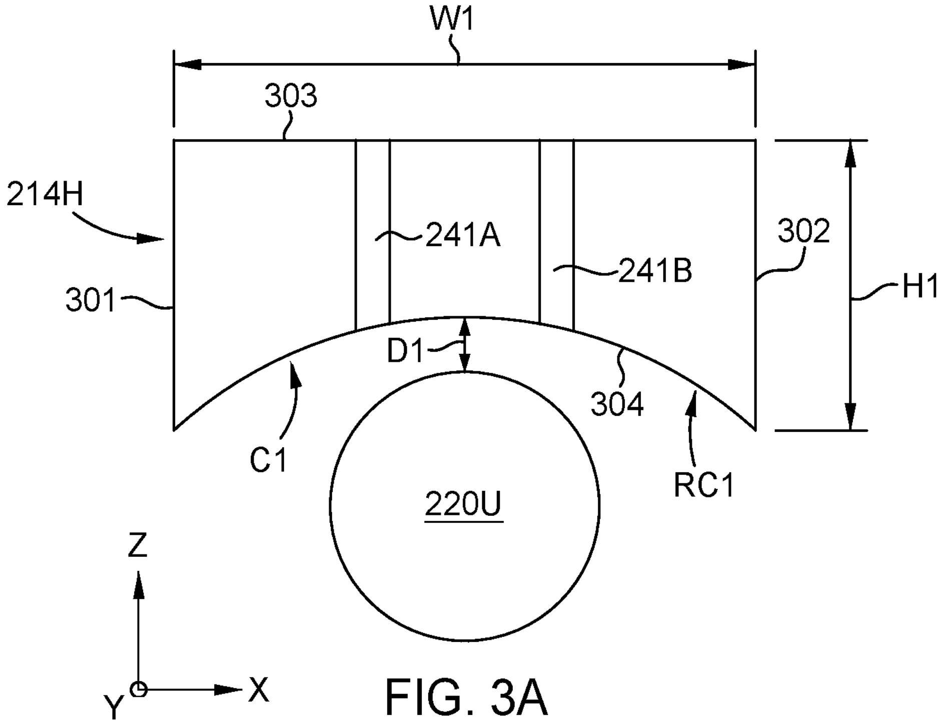
FIG. 3A is a side cross-sectional view of an exemplary reflective portion from FIG. 2A and a lamp, according to one embodiment.

FIG. 3A is a side cross-sectional view of the reflective portion 214H from FIG. 2A and a lamp 220U, according to one embodiment. The view in FIG. 3A is taken along section line 3A from FIG. 2A. Although FIG. 3A is described in reference to the reflective portion 214H, unless otherwise noted the description of FIG. 3A applies to all of the reflective portions 211-214 on both the upper reflector 200U and the lower reflector 200L.

As shown in FIG. 3A, the reflective portion 214H includes a first side 301, a second side 302, a third side 303, and a reflective surface 304 (also called fourth side). The third side 303 extends between the first side 301 and the second side 302. The third side 303 can be configured to contact the base 250U when the reflective portion 214H is mounted to the base 250U. The reflective surface 310 opposes the third side 303 and also extends between the first side 301 and the second side 302. The reflective surface 304 is configured to face one of the lamps 220U when the reflective portions 214H is mounted to the upper base 250U. Each reflective portion 21-214 on each reflector 200U, 200L is configured to face a corresponding lamp 220U, 220L in a similar configuration.

The reflective portion 214H has a height H1 in the vertical direction that corresponds to a length of the first side 301 and the second side 302. The reflective portion 214H has a width W1 in a horizontal direction that corresponds to the distance between the first side 301 and the second side 302. The reflective surface 304 of the reflective portion 214H is spaced apart from the lamp 220U by a first distance D1. The reflective surface 304 can be a curved surface with a radius of curvature RC1. The reflective portion 214H can further include a first cooling hole 241A and a second cooling hole 241B for directing cooling gas through the holes 241A, 241B during processing. The reflective surface 304 can be formed by a coating C1 (e.g., a coating of gold or alumina having a first thickness).

Figure 3B:
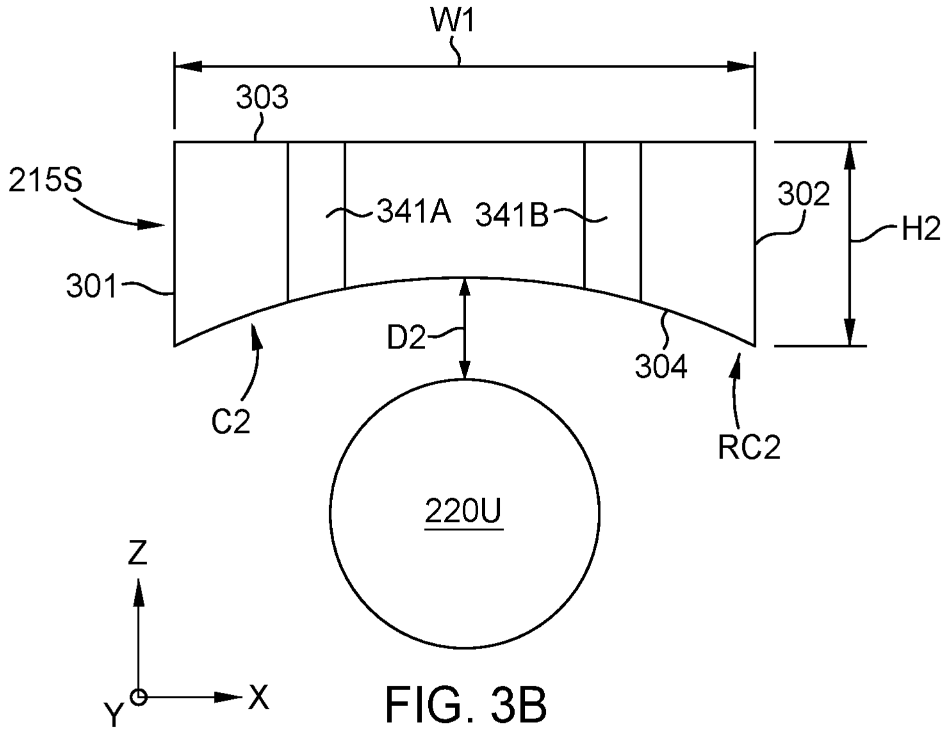
FIG. 3B is a side cross-sectional view of a spare reflective portion and a lamp, according to one embodiment.

FIG. 3B is a side cross-sectional view of a spare reflective portion 215S and a lamp 220U, according to one embodiment. The spare reflective portion 215S is configured to replace the reflective portion 214H described above in reference to FIG. 3A.

The spare reflective portion 215S has different reflective properties compared to the reflective portion 214H. Replacing the reflective portion 214H with the spare reflective portion 215S can be done to modify the intensity of radiation received across different portions of the substrate (e.g., near the edge of the substrate) during processing.

The spare reflective portion 215S has a height H2 in the vertical direction that is shorter than the height H1 of the reflective portion 214H described above. This reduced height H2 spaces the spare reflective portion 215S from the lamp 220U by a distance D2 when the spare reflective portion 215S is mounted to the base 250U. This distance D2 is greater than the distance D1 described above for distance between the reflective portion 214H and the lamp 220U. Although the spare reflective portion 215S has the same width W1 as the reflective portion 214H, in some embodiments the width of the reflective portion can also be changed when a reflective portion is replaced with another reflective portion.

The reflective surface 304 on the spare reflective portion 215S has a radius of curvature RC2 that is larger than the radius of curvature RC1 of the reflective surface 304 of the reflective portion 214H described above. The reflective surface 304 on the spare reflective portion 215S can be formed by a coating C2 that is different (e.g., different material, different thickness) than the coating C1 of the reflective surface 304 of the reflective portion 214H described above. Furthermore, the material (e.g., copper) that forms the body of the spare reflective portion 215S can also be different than the material (e.g., gold) that forms the body of the reflective portion 214H. The spare reflective portion 215S can further include a first cooling hole 341A and a second cooling hole 341B for directing cooling gas through the holes 341A, 341B during processing. The cooling holes 341A, 341B are larger than the corresponding cooling holes 241A, 241B described above for the reflective portion 214H. Furthermore, the cooling holes 341A, 341B are positioned closer to the sides 301, 302 of the spare reflective portion 215S than the cooling holes 241A, 241B are positioned to the sides 301, 302 of the reflective portion 214H.

Overall, the spare reflective portion 215S has a different size (e.g., height H2 is less than height H1), a different shape (radius of curvature RC2 is greater than radius of curvature RC1), a different coating (coating C2 instead of coating C1), is a different distance from the lamp 220 (distance D2 instead of D1), and includes a different cooling configuration (holes 341A, 341B instead of holes 241A, 241B) relative to the reflective portion 214H described above. Each one of these differences can individually be sufficient to substantially modify the reflective properties of a spare reflective portion compared to an existing reflective portion that is already installed. Although not shown, the reflective portions 214H, 215S can include the same set of fastener holes 242 (see FIG. 2B), so that the reflective portion 214H can be easily replaced with the spare reflective portion 215S using the same fasteners. The modular reflectors described herein enable relatively small portions of a reflector to be replaced quickly and easily compared to conventional practice in which an entire reflector is replaced when a modification relating to the reflector is made. For example, in some embodiments, each individually replaceable reflective portion 211-214 (see e.g., FIG. 2A) can have a reflective surface 304 (see FIG. 3A) that has a surface area that is less than 50%, such as less than 25%, such as less than 12.5%, such as less than 6%, such as less than 3% or less than 1% of the total reflective surface of the reflective assembly 210U (FIG. 2A), 210L (FIG. 2C).

Although FIG. 3B shows a spare reflective portion 215S that is configured to replace the reflective portion 214H, the modular system can include one or more spare reflective portions (not shown) with at least one different reflective property for each reflective portion 211-214 (e.g., all 28 reflective portions in FIG. 2A) for both the upper reflector 200U and the lower reflector 200L. This can enable modifications to be quickly made across any portion of the entire reflective surface of the reflector by replacing one or more of these reflective portions. The ease at which these reflective portions can be replaced can help operators select reflective portions that are better suited for improving process uniformity and enable reflector properties to be more easily modified when the process performed in the process chamber is modified. The modular reflector systems described above also enable reflective portions to be easily replaced with identical reflective portions, for example when a reflective portion is damaged (e.g., scratched). Replacing a single reflective portion, for example to address a scratched surface, can be significantly faster than replacing an entire reflector as done in conventional practice.

Furthermore, the modular reflector systems in this disclosure can also allow for the position of one or more reflective portions to be switched with the position of another reflective portion to see if an improvement in process uniformity can be achieved by the switching of the positions of the reflective portions. For example, with reference to FIG. 2A, the position of reflective portion 212F can be switched with the position of reflective portion 212C to determine if an improvement in process uniformity can be obtained by the position switch of these two reflective portions. As another example, the positions of reflective portions 212A, 212B, and 212C can be switched with the positions of the reflective portions 212F, 212E, and 212D to see if an improvement in process uniformity can be achieved. The position of the reflective portion 212A can be switched with the position of the reflective portion 212F, the position of the reflective portion 212B can be switched with the position of the reflective portion 212E, and the position of the reflective portion 212C can be switched with the position of the reflective portion 212D. In some embodiments, the modular reflector can be configured, so that the position of each reflective portion of the modular reflector, such as upper reflector 200U (see FIG. 2A) can be switched with the position of another reflective portion of the modular reflector. Having a configuration that allows the positions of different reflective portions to be switched on a modular reflector to improve process uniformity is another advantage offered by the modular reflectors disclosed herein that is not available from conventional reflectors that are replaced as an entire unit.

While the foregoing is directed to examples of the present disclosure, other and further examples of the disclosure may be devised without departing from the basic scope thereof, and the scope thereof is determined by the claims that follow.

What is claimed is:

1. A modular reflective heating system for use in a process chamber comprising:

a plurality of connectors;

a plurality of lamps, each lamp connected to at least one of the connectors;

a reflector comprising:

a base; and a reflective assembly including a first plurality of reflective portions and a second plurality of reflective portions, wherein each reflective portion in the first plurality of reflective portions and the second plurality of reflective portions is connected to the base, and each reflective portion in the first plurality of reflective portions and the second plurality of reflective portions is configured to be individually disconnected from the base; and a spare reflective portion configured to replace a first reflective portion in the first plurality of reflective portions or the second plurality of reflective portions.

2. The modular reflective heating system of claim 1, wherein the spare reflective portion has a reflective surface configured to face one of the lamps when the spare reflective portion is coupled to the base, the reflective surface on the spare reflective portion having a different radius of curvature, a different size, or a different coating than corresponding reflective surface on the first reflective portion.

3. The modular reflective heating system of claim 1, wherein each lamp of the plurality of lamps entirely underlies or entirely overlies a single reflective portion of the first plurality of reflective portions or the second plurality of reflective portions.

4. The modular reflective heating system of claim 1, wherein the second plurality of reflective portions are arranged in a ring-shaped pattern.

5. The modular reflective heating system of claim 4, wherein the first plurality of reflective portions are disposed inside the ring-shaped pattern of the second plurality of reflective portions.

6. The modular reflective heating system of claim 5, wherein the reflective assembly further comprises a third plurality of reflective portions connected to the base, wherein each reflective portion in the third plurality of reflective portions is configured to be individually disconnected from the base.

7. The modular reflective heating system of claim 6, wherein the third plurality of reflective portions are arranged in a ring-shaped pattern around the second plurality of reflective portions.

8. The modular reflective heating system of claim 1, wherein the base includes a cooling channel configured to cool the reflective assembly.

9. The modular reflective heating system of claim 1, wherein each connector extends through the base and one of the reflective portions in the first plurality of reflective portions or the second plurality of reflective portions.

10. A processing system comprising:

a process chamber comprising:

a chamber body disposed around a process volume;

a substrate support in the process volume;

a reflector positioned over or below the substrate support, the reflector comprising:

a base; and a reflective assembly including a first plurality of reflective portions and a second plurality of reflective portions, wherein each reflective portion in the first plurality of reflective portions and the second plurality of reflective portions is connected to the base, and each reflective portion in the first plurality of reflective portions and the second plurality of reflective portions is configured to be individually disconnected from the base; and a spare reflective portion configured to replace a first reflective portion in the first plurality of reflective portions or the second plurality of reflective portions.

11. The processing system of claim 10, wherein the spare reflective portion has a reflective surface with a different radius of curvature, a different size, or a different coating than corresponding reflective surface on the first reflective portion.

12. The processing system of claim 10, wherein the second plurality of reflective portions are arranged in a ring-shaped pattern.

13. The processing system of claim 12, wherein the first plurality of reflective portions are disposed inside the ring-shaped pattern of the second plurality of reflective portions.

14. The processing system of claim 13, wherein the reflective assembly further comprises a third plurality of reflective portions connected to the base, wherein each reflective portion in the third plurality of reflective portions is configured to be individually disconnected from the base.

15. The processing system of claim 14, wherein the third plurality of reflective portions are arranged in a ring-shaped pattern around the second plurality of reflective portions.

16. The processing system of claim 10, wherein the base of the reflector includes a cooling channel configured to cool the reflective assembly.

17. The processing system of claim 10, wherein the base of the reflector includes a plurality of holes configured to direct a cooling gas onto the reflective assembly.

18. A processing system comprising:

a process chamber comprising:

a chamber body disposed around a process volume;

a substrate support in the process volume;

a plurality of lamps;

a reflector positioned over or below the substrate support, the reflector comprising:

a base; and a reflective assembly including a first plurality of reflective portions and a second plurality of reflective portions, wherein the plurality of lamps are positioned between the substrate support and the reflector, each reflective portion in the first plurality of reflective portions and the second plurality of reflective portions is connected to the base, and each reflective portion in the first plurality of reflective portions and the second plurality of reflective portions is configured to be individually disconnected from the base; and a spare reflective portion configured to replace a first reflective portion in the first plurality of reflective portions or the second plurality of reflective portions, wherein the spare reflective portion has a reflective surface configured to face one of the lamps when the spare reflective portion is coupled to the base, and the reflective surface on the spare reflective portion has a different radius of curvature, a different size, or a different coating than corresponding reflective surface on the first reflective portion.

19. The processing system of claim 18, wherein the reflective assembly further comprises a third plurality of reflective portions connected to the base, wherein each reflective portion in the third plurality of reflective portions is configured to be individually disconnected from the base.

20. The processing system of claim 19, wherein the second plurality of reflective portions are arranged in a ring-shaped pattern around the first plurality of reflective portions, the third plurality of reflective portions are arranged in a ring-shaped pattern around the second plurality of reflective portions, and each lamp of the plurality of lamps entirely underlies or entirely overlies a single reflective portion of the first plurality of reflective portions, the second plurality of reflective portions, or the third plurality of reflective portions.

* * * * *